United States Patent [19]

Jiang

[11] Patent Number: 5,789,772
[45] Date of Patent: Aug. 4, 1998

[54] SEMI-INSULATING SURFACE LIGHT EMITTING DEVICES

[75] Inventor: Ching-Long Jiang, Belle Mead, N.J.

[73] Assignee: The Whitaker Corporation, Wilmington, Del.

[21] Appl. No.: 912,800

[22] Filed: Aug. 18, 1997

Related U.S. Application Data

[63] Continuation of Ser. No. 572,284, Dec. 13, 1995, abandoned, which is a continuation-in-part of Ser. No. 276,131, Jul. 15, 1994, abandoned.

[51] Int. Cl.$^6$ .................. H01L 33/00; H01L 29/76; H01L 29/94; H01L 31/062
[52] U.S. Cl. ........................... 257/96; 257/413
[58] Field of Search ........................... 257/96, 413

[56] References Cited

U.S. PATENT DOCUMENTS

| | | | |
|---|---|---|---|
| 4,188,244 | 2/1980 | Itoh et al. | 148/174 |
| 4,845,724 | 7/1989 | Hayakawa | 372/45 |
| 4,999,315 | 3/1991 | Johnston, Jr. | 439/94 |
| 5,003,358 | 3/1991 | Takahashi et al. | 357/17 |
| 5,100,833 | 3/1992 | Takahashi et al. | 437/129 |
| 5,122,844 | 6/1992 | Akiba et al. | 357/17 |
| 5,135,877 | 8/1992 | Albergo et al. | 437/23 |
| 5,179,567 | 1/1993 | Uomi et al. | 372/46 |
| 5,194,399 | 3/1993 | Takahashi et al. | 437/129 |
| 5,275,596 | 1/1994 | Takahashi et al. | 437/129 |
| 5,309,467 | 5/1994 | Terakado | 372/45 |
| 5,325,385 | 6/1994 | Kasukawa | 372/46 |
| 5,345,464 | 9/1994 | Takemoto | 372/46 |
| 5,452,315 | 9/1995 | Kimura | 372/46 |
| 5,544,189 | 8/1996 | Fukushima | 372/46 |

FOREIGN PATENT DOCUMENTS

| | | | |
|---|---|---|---|
| 0 344 904 | 12/1989 | European Pat. Off. | H01S 3/19 |
| 633-7783 | 12/1988 | Japan | 297/95 |
| 02 020085 | 3/1990 | Japan . | |
| 02 170486 | 9/1990 | Japan . | |
| 3011688 | 1/1991 | Japan | H01S 3/18 |

| | | |
|---|---|---|
| WO A 86/00172 | 1/1986 | WIPO . |

OTHER PUBLICATIONS

Topical Meeting on Semiconductor Lasers; InGaAsP/InP Planar Buried heterostructure Laser With Semi–Insulating InP Current Blocking Layers Grown By MOCVD.; 1987.

PCT International Search Report; International App. No. PCT/US95/07313; Aug. 6, 1995.

GaInAsP/InP Surface Emitting Injection Lasers With Short Cavity Length; *IEEE Journal of Quantum Electronics*; vol. QE–19, No. 6, Jun. 1983.

"Circular Buried Heterostructures(CBH) GaAlAS Surface Emitting Lasers"; *IEEE Journal of Quantum Electronics*; vol. QE–23 No. 6; Jun. 1987; Kinoshita et al.

GaInAsP/InP Surface–Emitting Lasers With Current Confining Structure; *Journal of LightWave Techology*; vol. Lt–4; Jul. 1986; Uchiyama et al.

"Resonant Cavity Light–Emitting Diode"; *Applied Phys. Lett.*; vol. 60; No. 8; Feb. 1992; Schubert et al.

"Resonant Cavity Light–Emitting Diode and Detector Using Epitaxial Liftoff"; *IEEE Photonics Technology Letters*; vol. 5; No. 9; Sep. 1993; Corbett et al.

"Development of Mesa LEDs for 1 GBPs Fiberoptic communication"; Sumitomo; Electric Technical Review; No. 341; Jun. 1992; Ogata et al.

(List continued on next page.)

*Primary Examiner*—Stephen Meier

[57] ABSTRACT

Light emitting devices are requiring greater switching speeds to achieve greater modulation bandwidths. The problems of intrinsic capacitance associated with conventional semiconductor heterojunction devices are reduced by the reduction of pn junction capacitance as well as the use of a semi-insulating blocking layer and a conductive substrate. Non-linearity of optical power output versus bias current is addressed by a heat dissipation scheme using the semi-insulative and conductive layers of the device.

11 Claims, 6 Drawing Sheets

OTHER PUBLICATIONS

*American Electroplaters and Surfce Finishers Society, Inc.;* "Novel Plating Technique on Electrically Isolated Mesas With Non–Planar Surface".

*Journal of Applied Phys;* Growth and Characterization of Fe–doped Semi–Insulating InP prepared by low–pressure organometallic vapor phase epitaxy with tertiarybutylphosphine; Huang et al.; Jun. 1991.

Journal of Crystal Growth; Transistion metal dopinf of Lp–MOCVD–grown InP; Wolf et al.; 1991.

Inst. Phys. Conf. Ser. No. 91; Chapter 3; "Ti–Fe Co–doped semi–insulating InP grown by MOVPE"; Dentai et al.; 1988.

*IEEE Journal of Quantum Electronics;* "*Lateral npn Junction and Semi–insulating GaAs Current Confinement Structure for Index–Guided InGaAs/AlGaAs Lasers by Molecular Beam Epitaxy*"; vol. 29; No. 6; Jun. 1993; Takamori et al.

SEMI-INSULATING SURFACE LIGHT EMITTING DEVICES

This application is a Continuation of application Ser. No. 08/572,284 filed Dec. 13, 1995, now abandoned, in turn, a Continuation-in-Part of application Ser. No. 08/276,131 filed Jul. 15, 1994, abandoned.

FIELD OF THE INVENTION

The present invention relates to semiconductor light emitting devices with increased operating speed and near linear light output versus current input characteristics.

BACKGROUND OF THE INVENTION

The advent of heterostructure semiconductor devices has lead to the ease in fabrication and improved characteristics of many types of semiconductor devices. The light emitting diode (LED) the subject of the present invention, are examples of a device that benefits greatly from the use of heterostructure device design. Generally, the heterostructure employed in the fabrication of an LED is a double heterostructure, in which an active region III-V semiconductor (ternary or quaternary) is sandwiched between two oppositely doped III-IV compounds. By choosing appropriate materials of the outer layers, the band gaps are made to be larger than that of the active layer. This procedure, well known to the skilled artisan, produces a device that permits light emission due to recombination in the active region, but prevents the flow of electrons or holes between the active layer and the higher band gap sandwiching layers due to the differences between the conduction band energies and the valence band energies, respectively. An example of this is shown in FIG. 1, which is an energy band diagram of an N-n-P (where N,P are indicative of materials with greater band gaps than the n-doped active region) double semiconductor heterostructure, which shows the discontinuities 2,3 in energy levels of the conduction band energy ($E_c$) and the valence band energy ($E_v$) at the depletion regions that create the confinement of electrons and holes in the active region 1 (the Fermi level $E_f$, is aligned at all three materials). The minority carrier concentration (holes) in the sandwiched region can have a magnitude comparable to the majority carrier concentration in the p-doped region. Accordingly, upon application of a junction forward bias, recombination takes place in and is essentially restricted to the central region, a feature of great advantage in the LED. A further advantage stems from a structure such as that shown, is that the dielectric constant of the higher bandgap layers is lower than that of the central lower bandgap region. Accordingly, the index of refraction of the lower bandgap region is higher than that of the lower bandgap regions, an a natural dielectric slab (assuming a rectangular layer structure) waveguide is formed.

Light emitting devices can be fabricated to emit light from an edge of the active layer, or as stated above from a surface. The devices can be either light emitting diodes or lasers. For the purposes of clarity of instruction, one particular design will be described in detail. The particular design shows an surface emitting LED an n-type substrate. However the same principles apply for these light emitting devices on a p-type substrate. Furthermore, the active layer composition for the laser devices can be either of conventional bulk material or strained or unstrained quantum well type material. A Surface Edge Emitting Light Emitting Diode (SLED), fabricated by conventional techniques is shown in FIGS. 2–4. In the particular example shown, an n-type indium phosphide (n-InP) substrate 21,31,41 has grown thereon an n-type buffer layer (not shown) p-type InGaAsP active layer 22,32, 42, a p-type cladding layer of for example p-InP 23,33,43 and a p-type contact layer of for example p-InGaAs 24,34, 44. These layers are grown on the substrate epitaxially. Furthermore, the materials are chosen so that the active layer has a lower band gap energy than that of its neighboring p and n type layers.

After the layers are grown, etching by standard techniques is performed so that a moat 35 is created leaving a central mesa 36, as is shown in FIG. 3. As is seen in FIG. 4, a dielectric layer 45 of $SiO_2$ or $SiN_x$, for example, is then deposited over the mesa and surrounding area. However, the dielectric on the top of the mesa is removed for the purposes of making an electrical contact opening. This dielectric is of poor thermal and electrical conductivity, and serves to isolate the active layer 42 and the substrate 41 from the subsequently p-type metal contact layer 46. The p-type metal is deposited by conventional technique after the contact opening in the dielectric layer 45 is made. While serving as an excellent isolator, the dielectric layer has the adverse effect of poor thermal conductivity. This poor thermal conductivity inhibits the dissipation of heat from the active region to the peripheral regions.

Another disadvantage of this conventional device is the parasitic capacitance of the peripheral region. This capacitance has an increased effect on the intrinsic RC time constant of the device, which serves to drastically reduce the switching speed of the device. With the desire for higher switching speeds, particularly the desire to reduce the rise and fall times of a digital signal, the ill-effects of parasitic capacitance must be reduced. Examples of attempts to curb the ill-effects of parasitic capacitance can be found in related U.S. Pat. Nos. 5,003,358; 5,100,833; 5,194,399 and 5,275, 968 to Takahashi, et al. the disclosures of which are specifically incorporated herein by reference.

As is disclosed in the '358 reference, a semi-insulating or insulating substrate has deposited thereon a semi-insulating layer of InP which is etched to accommodate the p and n side electrodes as well as an vertical aperture in which an active layer is grown between p and n type cladding layers. Thereby, a light emitting device is formed in the aperture. Connecting the n-type cladding to the n side electrode is an conducting n-type InP layer which is buried in a groove etched in the semi-insulating layer. This structure, having the light emitting device in a relatively small and confined region, reduces the intrinsic parasitic capacitance by reducing the area of the p-n junctions of the device, and thereby the capacitance which is directly proportional to the area of the p-n junction. A good understanding of the ill-effects of this parasitic peripheral pn junction capacitance is found by a review of the prior art disclosed in FIG. 5 of the '358 reference.

However, as can be appreciated from the above referenced patents to Takahashi, et al. the etching and fabrication of these light emitting devices are rather complicated. What is needed is a light emitting device that can be fabricated simply, and thereby at a low cost, yet still exhibits the reduction in intrinsic capacitance.

Another ill-effect of conventional light emitting devices is the poor ability to dissipate joule heat, and the resulting non-linear light versus current characteristics. What is needed is a fast switching light emitting devices with relatively linear light output power versus current input characteristics.

While the discussion up to this point has focused on the LED, as we will see, the present invention is intended for application to light emitting devices including diodes and lasers. For exemplary purposes, a particular structure will be the principle focus of discussion. To this end, a discussion will follow which describes the fabrication of light emitting device that are surface emitters fabricated on an n-type substrate. However, it is clear that both basic types of devices can be fabricated on a p-type substrate. Finally, the active layer construction for the laser devices can be either of conventional bulk material, or strained or unstrained quantum well type material.

SUMMARY OF THE INVENTION

The present invention is a surface light emitting device (SLED) having reduced intrinsic, parasitic capacitive effects through the use of a mesa structure as well as a semi-insulating layer which substantially surrounds the mesa structure. The deposition of the semi-insulating layer as the isolating layer serves to decrease the capacitance between the p-electrode and the n-electrode outside the mesa region. The advantage of having a reduction of the overall intrinsic capacitance of the SLED is a great reduction in rise and fall times of the device due to a reduction in the device RC time constant. The SLED as designed exhibits rise and fall times on the order of 0.5 nanoseconds. Furthermore, this rapid switching capability has resulting bandwidth of over 700 megahertz, a significant increase in bandwidth over the bandwidth of conventional devices. Furthermore, the invention of the present disclosure improves the ability of the device to dissipate joule heat generated during the operation of the device. Joule heating in conventional light emitting devices results in non-linear light output power versus bias current.

The structure of the present invention has the ability to dissipate heat through two paths. First, the semi-insulating layer dissipates joule heat through its inherent thermal conductivity properties allowing heat to be dissipated away from the pn junctions of the mesa structure as well as allowing the device to operate at high injection current levels without significant heating of the pn junctions. This improves greatly the light output power linearity with respect to bias current. Secondly, the n-doped conducting layer itself acts as a path to dissipate joule heat away from the pn junctions of the mesa structure. Finally, as can be appreciated from a reading of the disclosure of the present invention, the processing steps to effect the device of the present invention are far less complex than is required to effect other conventional devices.

OBJECTS, FEATURES, AND ADVANTAGES

It is an object of the present invention to provide a semiconductor surface light emitting device in nearly planar form having a reduced intrinsic capacitance and an improved capability to dissipate heat, thereby exhibiting more linear light output power versus current input characteristics.

It is a feature of the present invention to have a mesa structure light emitting device having a semi-insulating layer substantially surrounding the mesa structure to reduce parasitic capacitance, as well as to dissipate joule heat.

It is a further feature of the invention to have a conductive substrate to dissipate joule heat.

It is an advantage of the present invention to have a light emitting device that is fabricated in a simple, less complicated fashion than conventional light emitting devices, thereby reducing the cost while exhibiting reduced intrinsic capacitance.

DETAILED DESCRIPTION OF THE PREFERRED EMBODIMENTS

Figure 5:
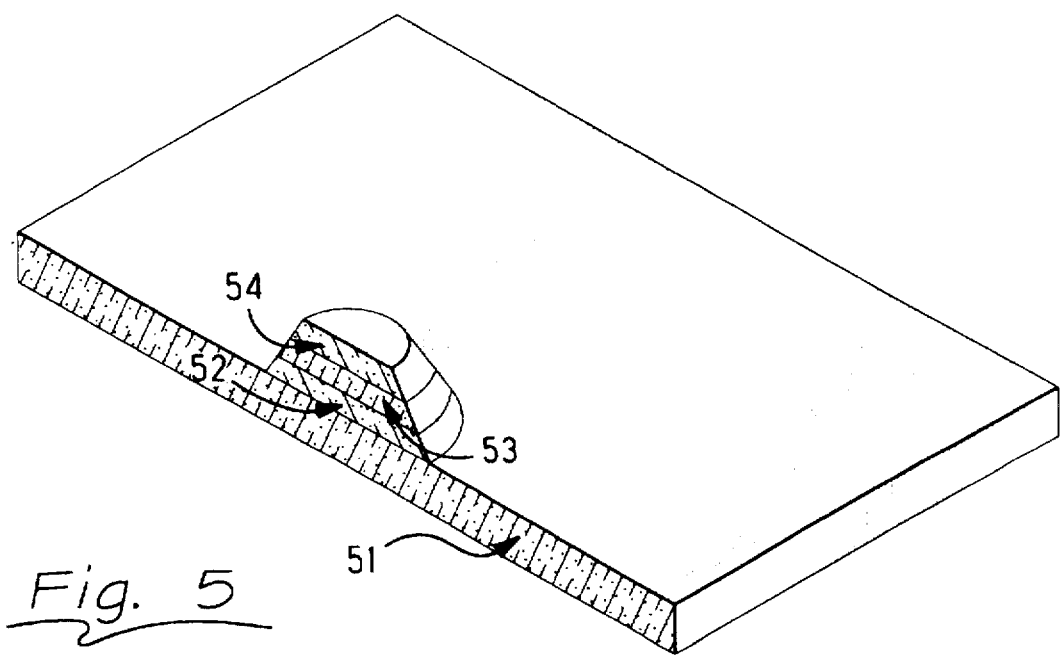
FIG. 5 is a cross sectional view of the present invention after mesa etching.
Figure 6:
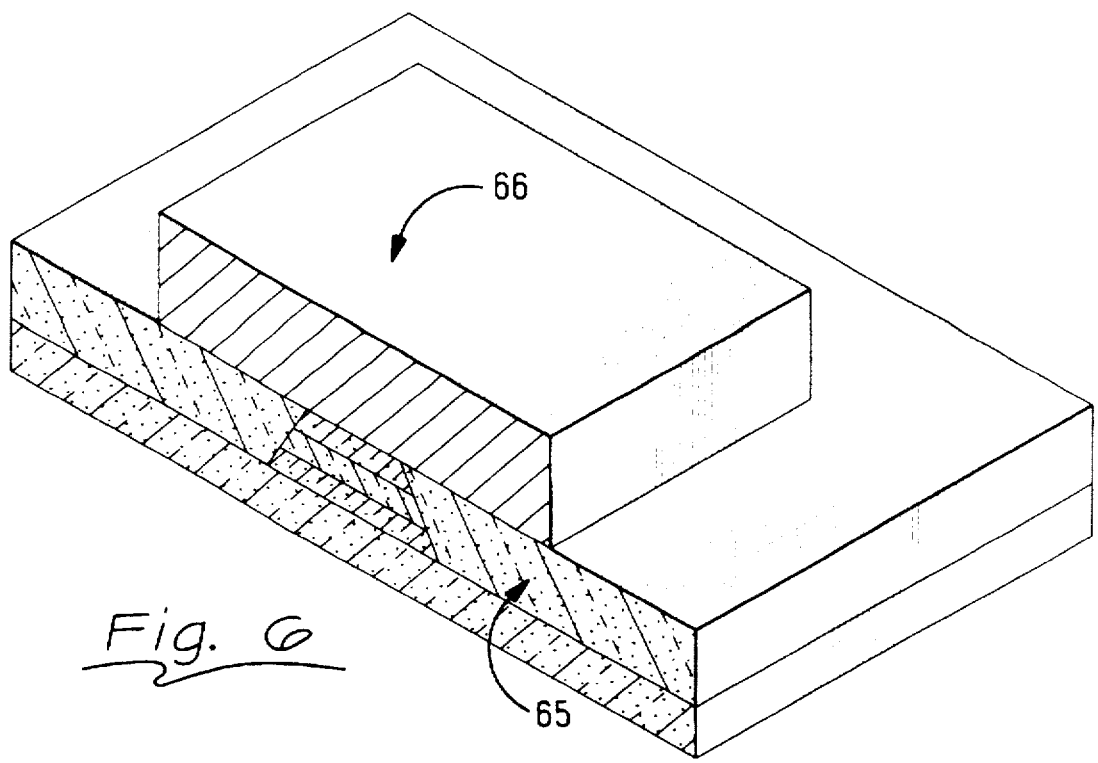
FIG. 6 is a cross sectional view of the present invention.

Turning to FIG. 5, we see the cross section of the SLED of the present invention. The substrate 51 is for example an n-InP wafer that is doped to a degree that it is conductive, for example doping levels of approximately $10^{17}$ to $10^{19}$ cm$^{-1}$. A heterostructure is formed by epitaxially growing successive layers of an n-InP buffer (not shown), an InGaAsP for the active layer 52, a p-InP for the p type cladding 53 and a p contact layer 54 thereon. The epitaxial material is grown first in a planar structure and is then masked with dielectric or photoresist. The mask is patterned and partially removed. The exposed area is then etched by an isotropical etchant to leave the mesa structure as shown. After the mesa is exposed, a layer of high thermal conductivity, electrically semi-insulating material is deposited. As shown in FIG. 6, this isolating layer 65 is for example a layer of semi-insulating iron doped InP which serves to isolate the active layer and the substrate from the subsequently deposited p-type metal layer 66. The surface light emitting device then functions as described above, having an n-electrode and a p-electrode contacting the conducting substrate 51 and the p-metal contact 66, respectively. The light is transmitted through the n-InP conducting substrate, which is transparent to the emitted light due to the fact that its bandgap is greater than that of the active region, as described above.

Figure 1:
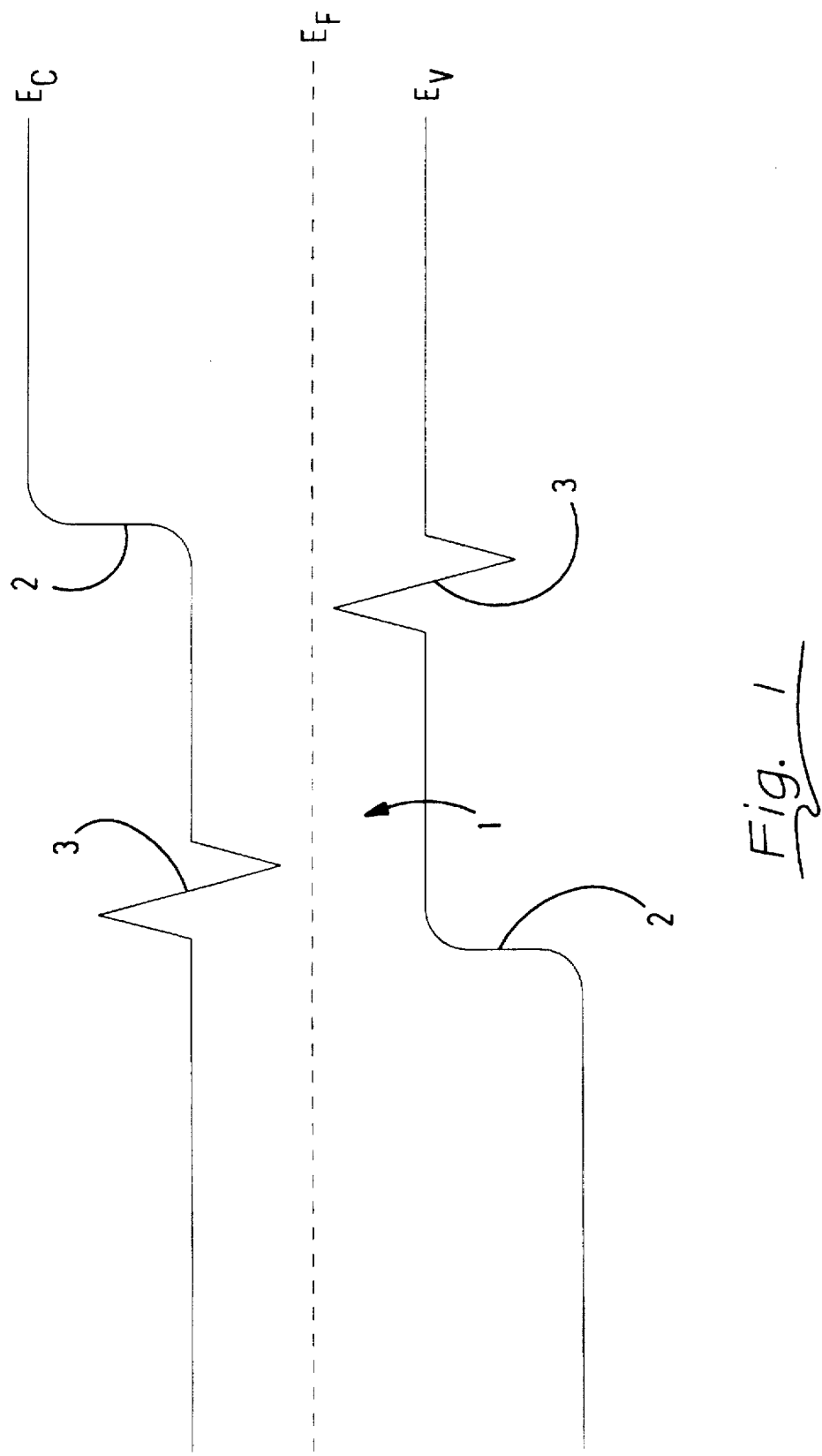
FIG. 1 is an example of an energy band diagram of a double heterostructure junction with an active layer having a lower band gap than the outer layers.
Figure 2:
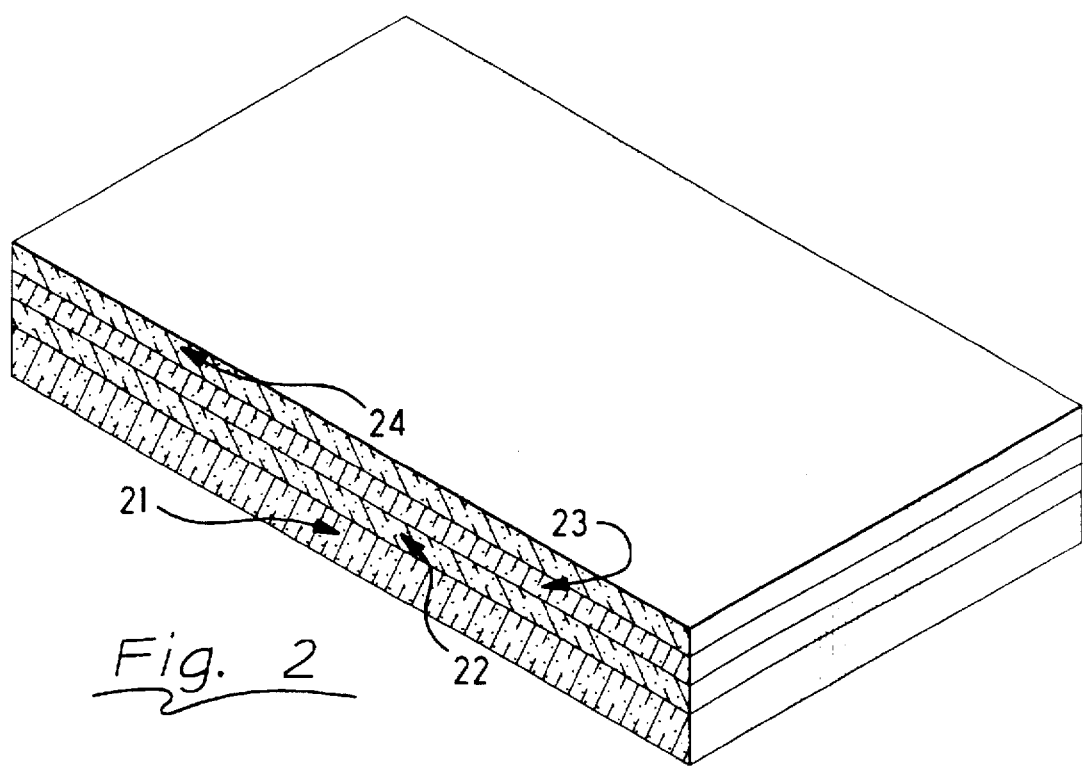
FIG. 2 is a schematic cross sectional view of planar growth of materials needed to fabricate a conventional SLED.
Figure 3:
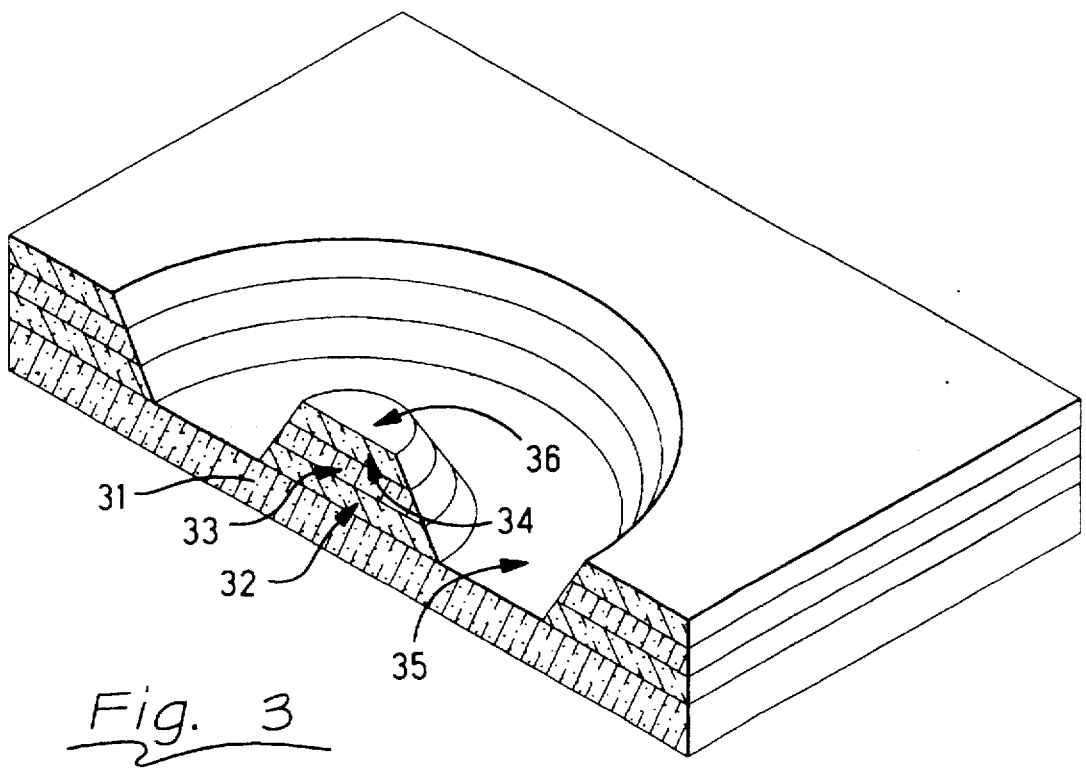
FIG. 3 is a cross section of an etched mesa in a conventional SLED.
Figure 4:
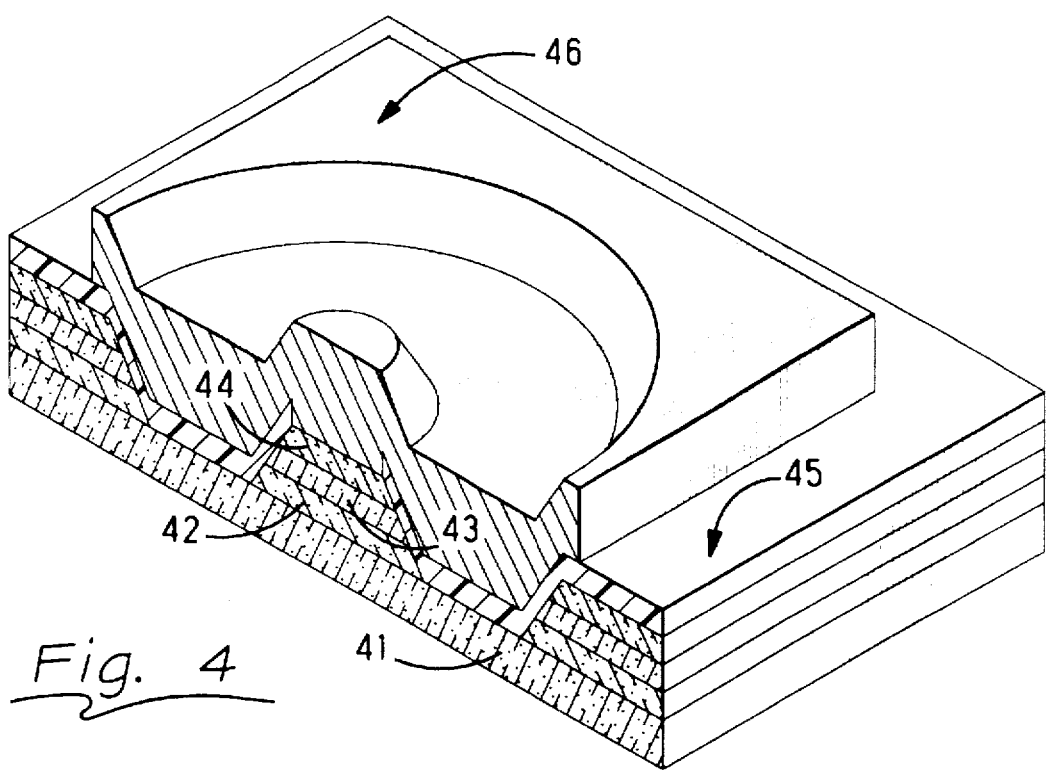
FIG. 4 is a cross-sectional view of a conventional SLED.

The benefits of the structure of the device described above and shown in FIG. 5 are as described presently. First, this structure minimizes the area of the pn junctions through mesa structure, and has the benefit thereby of reducing the ill-effects of pn junction capacitance. Secondly, the deposition of a semi-insulating layer as the isolating layer 65 serves as well to decrease the capacitance between the p-electrode and the n-electrode, outside the mesa region. It is important to note that this reduction of the capacitance is achieved by rather simple one step etching techniques, and avoids the more complex multi-etching techniques required in the fabrication of the devices as shown in U.S. Pat. Nos. 5,003,358; 5,100,833; 5,194,399 and 5,265,968, which were previously incorporated by reference. The advantage of having a reduction in the overall intrinsic capacitance of the SLED is the great reduction in rise and fall time of the device due to a reduction in the device RC time constant. Reducing the RC time constant increases the switching speed, and in the realm of nearly square-wave digital signals, the benefits are rather obvious. This SLED as designed experiences rise and fall times on the order of 0.5 nanoseconds. This rapid switching capability has resulted in a bandwidth of over 700 MHz, a significant increase over the bandwidth of a conventional device as shown in FIG. 4.

Another benefit of the present device design is its capability to dissipate the joule heat generated in operation. Joule heating in conventional light emitting devices results in non-linear light output power versus bias currents. The structure of the present invention has the ability to dissipate heat through two paths. Turning to FIG. 6, the layer of semi-insulating InP 65 which has a thermal conductivity of approximately 0.68 watt-cm$^{-1}$-K$^{-1}$ forms one path. The layer 65 has the same thermal expansion coefficient and lattice constant as the n-doped InP substrate, and can thereby be grown to any desired thickness, which has obvious ramifications relative to the degree of electrical isolation as well as the ability of the device to dissipate heat. For example, this could be a layer of Fe-doped InP exhibiting a resistivity in the range $10^6-10^{10}$ Ohm-cm, however other materials could be used in keeping with the theme and spirit of the invention. The dissipation of heat away from the pn junctions of the mesa structure allows the device to operate at high injection current levels without significant heating of the pn junctions, thereby improving the light output power linearity with respect to bias current. Finally, the n-doped conducting layer 51 itself acts as a second path to dissipate joule heating away from the pn junctions of the mesa structure as well with the same benefit as just described. These two sources have an additive effect on heat dissipation.

Finally, a study of the device as shown in FIG. 6 shows the simplicity of construction that has an added benefit not previously mentioned. By making the substrate of an conductive material, the n-type electrode can be directly connected to the substrate, eliminating an additional processing step. So, in addition to providing a better thermal dissipation path, the conducting substrate acts as an electrical connection point as well, keeping the device profile smaller than the other reduced capacitance devices as described in the patents which have been incorporated herein by reference.

Figure 7:
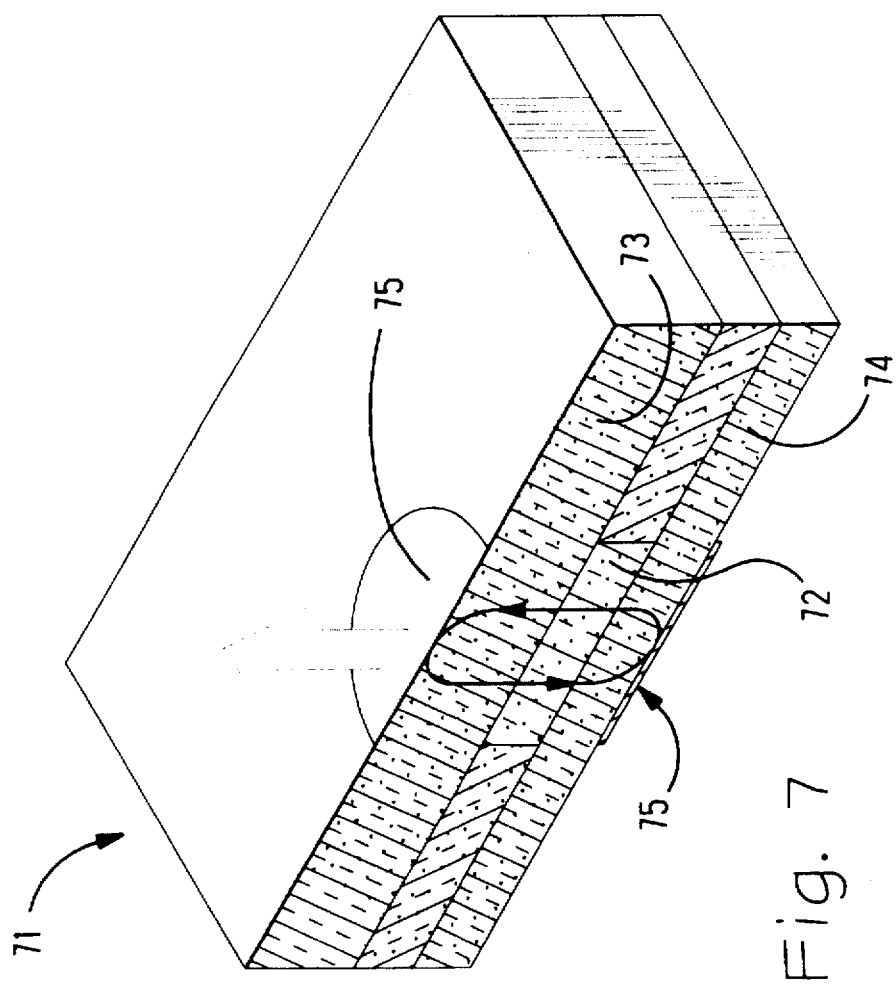
FIG. 7 is cross sectional view of a surface emitting laser without a blocking layer.

Turning now to FIG. 7, we see a conventional surface emitting laser, 71. The basic principles of the double heterojunction LED carries over to the laser 71. To be specific, an active layer 72 of bulk, strained or unstrained quantum well semiconductor materials, for example p-GaAS/p-GaAlAs is sandwiched between two layers of higher bandgap materials 73 and 74. For exemplary purposes, material 73 could be p-GaAlAs and 74 could be n-GaAlAS. These materials 73 and 74 are chosen to have not only greater bandgaps than that of the active region, but also a lower index of refraction. Accordingly, the index of refraction of the active region is $n_1$ and that of the materials 73 and 74 $n_2$, where $n_1>n_2$. In doing so, a waveguide is created in the active region. Reflectors, here shown as mirrors 75, serve to establish a resonant cavity. Finally, the energy bandgaps of the materials are chosen to facilitate the required inversion for lasing, as well as carrier confinement. The fact that the recombination region is well defined and of fixed dimension results in a cavity that tends to confine the optical wave in the active region, thereby providing amplification for a larger fraction of the wave than would be the case in an unguided wave. The end result is a higher degree of optical efficiency, thereby requiring smaller input current per unit output power, and therefore a reduction in heat.

Figure 8A:
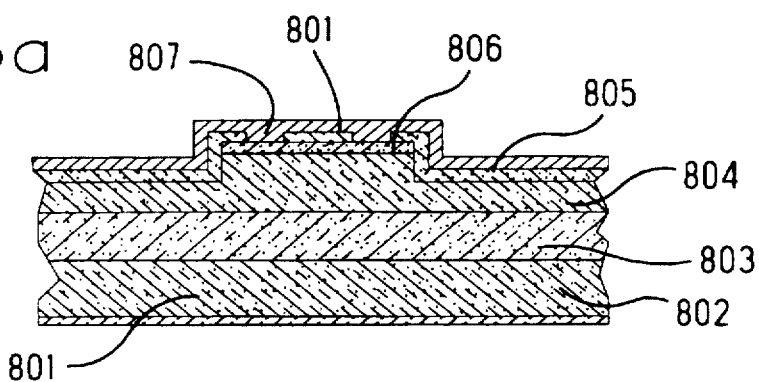
FIGS. 8a–8d are schematic views of various types of conventional surface emitting lasers.
Figure 8B:
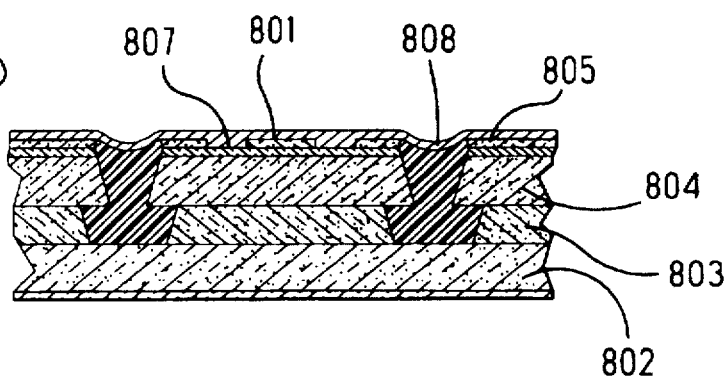
Figure 8C:
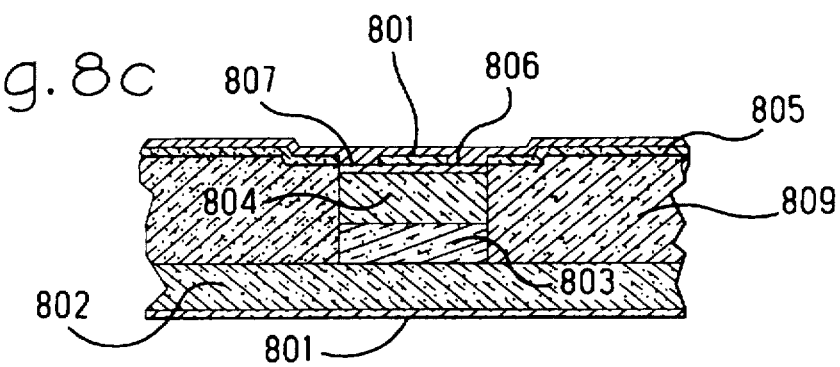
Figure 8D:
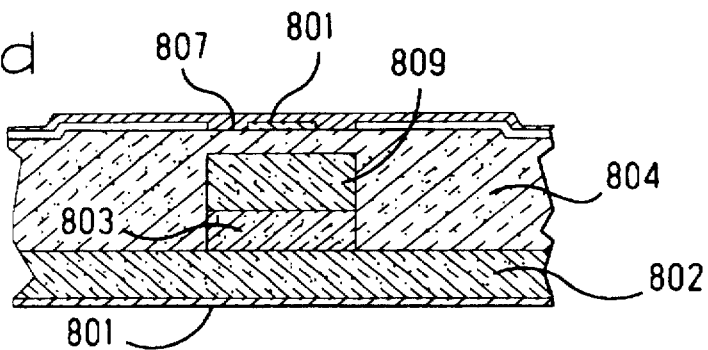

However, as mentioned in relation to the double heterostructure SLED, the relatively large area of pn junctions in the peripheral regions associated with lasers such as that shown in FIG. 7, leads to undesired parasitic capacitance. This capacitance has damaging effects on the rise and fall response times of the laser, resulting in a reduced modulation bandwidth. FIGS. 8a-8d show various types of heterostructure lasers which are conventional in the art. FIG. 8a is an example of a laser having no current blocking layer. FIGS. 8b shows the use of polyimide as a blocking layer, and FIGS. 8c and 8d show the use of reverse bias junctions to effect a potential barrier current blocker. The significance of current confinement is the ability to increase optical efficiency of the optical resonator. However, as described in relation to the LED, all of the structures of FIG. 8 have the problems associated with parasitic capacitance and dissipation of joule heating.

Figure 9:
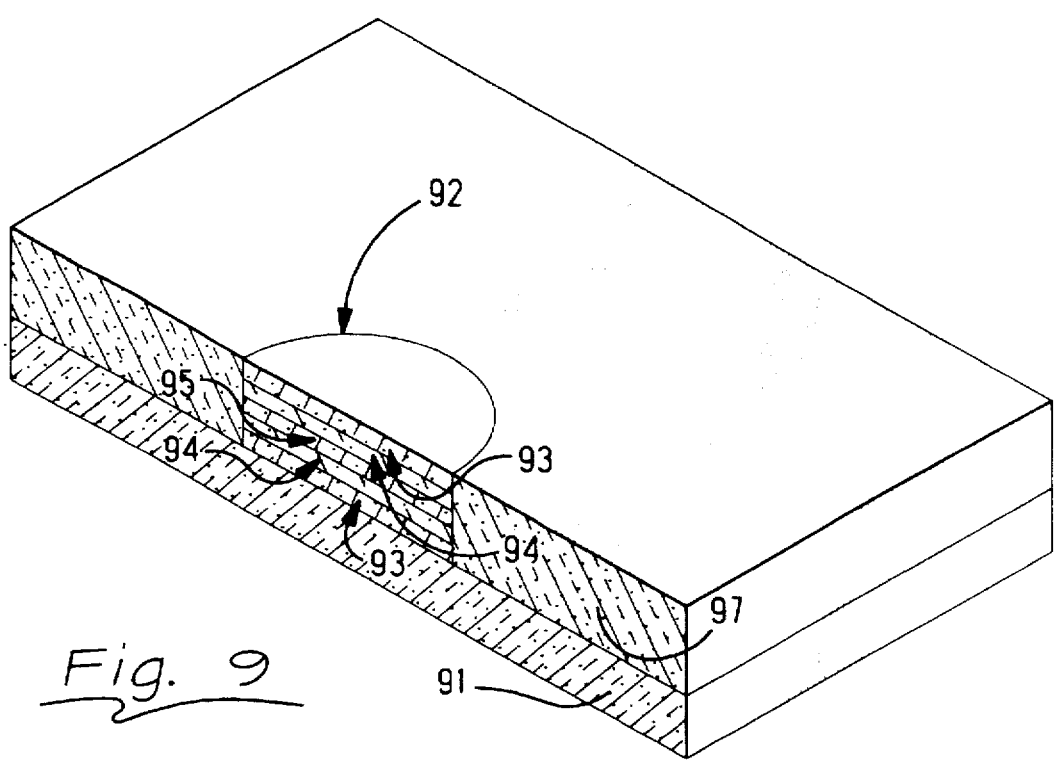
FIG. 9 is a cross sectional view of a laser of the present invention.

Turning to FIG. 9, we see a laser fabricated by the designs of the present invention. In particular, the substrate 91 is an n-type conductive layer, and the mesa structure 92 is of the same basic design as that of the LED with the exception that reflectors 93 are disposed so as to enable the resonance required to lase. These reflectors are deposited or placed by standard techniques readily known to the skilled artisan. The InP cladding layers 94 provide the carrier confinement as well as the cladding layers for the waveguide established in the active layer 95.

The layer of InP 97 is chosen for its semi-insulative properties. For example, this could be a layer of Fe-doped InP exhibiting a resistivity in the range $10^6-10^{10}$ Ohm-cm, however other materials could be used in keeping with the theme and spirit of the invention. These layer 97 again serves to reduce the overall parasitic capacitance of the device, and thereby increase the modulation bandwidth of the laser. Finally, as mentioned in rather great detail in relation to the SLED, the layers 91 and 97 serve to dissipate heat, resulting in more linear characteristics of the laser output, and the layer 91 enables the direct electrical contact to the device.

It is of great importance to note that the discussion has focused on the design of a SLED and a laser. However the basic principles of this invention could readily be implemented to produce a laser, a resonant cavity LED (RCLED) and other surface emitting light emitting devices. Other materials could be used to fabricate the above mentioned devices, and the materials discussed are specifically named for instructional purposes, and are not intended to be limiting. Again, the discussion has described the fabrication of light emitting devices that are surface emitters fabricated on an n-type substrate. However, it is clear that both basic types of devices can be fabricated on a p-type substrate. All such variations of this basic design and materials as could be implemented by the ordinary skilled artisan are considered within the theme and spirit of the invention. Finally, the active layer construction for the laser devices can be either of conventional bulk material, or strained or unstrained quantum well type material.

Various modifications will become apparent to those of ordinary skill in the art. To this end, through the basic teaching of the present invention, a mesa structure surface light emitting device having a semi-insulating layer to reduce capacitance and dissipate heat. One of ordinary skill in the art could make modifications with the theme and spirit of the invention. Such modifications are considered within the purview of the invention.

I claim:

1. A semiconductor light emitting device, comprising: a conductive substrate; a round mesa disposed on said conductive substrate, said mesa further comprising an optically active layer disposed on a buffer layer; a cladding layer on said optically active layer; a layer of semi-insulating material disposed on said substrate and surrounding said mesa, said semi-insulating layer being in contact with said buffer layer, said optically active layer, and said cladding layer; and device being a surface emitting device with light being transmitted through said conductive substrate.

2. A semiconductor light emitting device as recited in claim 1 wherein a contact layer is disposed on top of said cladding layer said contact layer being in electrical contact with said mesa, and said layer of semi-insulating material being in contact with said contact layer.

3. A semiconductor light emitting device as recited in claim 2, wherein said substrate is n-doped and said contact layer is p-doped.

4. A semiconductor light emitting device as recited in claim 2, wherein said conductive substrate is p-doped and said layer of contact material is n-doped.

5. A semiconductor light emitting device as recited in claim 1, wherein said layer of semi-insulating material has a resistivity in the range of $10^6$–$10^{10}$ ohm-cm.

6. A semiconductor light emitting device as recited in claim 1, wherein said conductive substrate has a doping level in the range of approximately $10^{17}$–$10^{19}$ cm$^{-1}$.

7. A semiconductor light emitting device as recited in claim 1, wherein said semi-insulating material has a thermal conductivity on the order of 0.68 Watt-cm$^{-1}$-K$^{-1}$.

8. A semiconductor light emitting device, comprising: a conductive substrate, a round mesa disposed on said conductive substrate, said mesa further comprising a first reflector, a first layer of semi-conductor material disposed on top of said first first reflector, an active layer disposed on top of said first layer of semiconductor material, a second layer of semiconductor material disposed on said active layer, and a second reflector disposed on top of said second layer of semiconductor material; a layer of semi-insulating material disposed on said substrate and surrounding said mesa, said layer of semi-insulating material being in contact with said first reflector, said first layer of semi-conductor material, said active layer, said second layer of semiconductor material and said second reflector, the device being a surface emitting device.

9. A semiconductor light emitting device as recited in claim 8, wherein a contact layer is disposed on top of said mesa and in electrical contact with said mesa, and said layer of semi-insulating material being in contact with said contact layer.

10. A semiconductor light emitting device as recited in claim 9, wherein said substrate is n-doped and said contact layer is p-doped.

11. A semiconductor light emitting device as recited in claim 8, wherein said active layer further comprises a quantum-well material.

* * * * *